United States Patent
Pannwitz

(10) Patent No.: US 7,747,790 B2
(45) Date of Patent: Jun. 29, 2010

(54) INTEGRATED DRIVER CIRCUIT FOR LIN BUS WHEREIN CIRCUIT IS OPERABLE BETWEEN AN OLDER LIN BUS SPECIFICATION OR A NEWER LIN BUS SPECIFICATION

(75) Inventor: Axel Pannwitz, Radebeul (DE)

(73) Assignee: Atmel Automotive GmbH, Heilbronn (DE)

( * ) Notice: Subject to any disclaimer, the term of this patent is extended or adjusted under 35 U.S.C. 154(b) by 145 days.

(21) Appl. No.: 11/947,764

(22) Filed: Nov. 29, 2007

(65) Prior Publication Data

US 2008/0211546 A1 Sep. 4, 2008

Related U.S. Application Data

(60) Provisional application No. 60/861,968, filed on Dec. 1, 2006.

(30) Foreign Application Priority Data

Nov. 29, 2006 (DE) .................... 10 2006 058 184

(51) Int. Cl.
*G06F 3/00* (2006.01)
*G06F 13/00* (2006.01)
*H03K 3/00* (2006.01)

(52) U.S. Cl. ............... 710/14; 710/8; 710/9; 710/10; 710/15; 710/62; 710/110; 713/1; 713/2; 327/108

(58) Field of Classification Search ........... 710/8–10, 710/14, 15, 62, 110; 713/1, 2; 327/108
See application file for complete search history.

(56) References Cited

U.S. PATENT DOCUMENTS 5,623,506 A * 4/1997 Dell et al. .................... 714/766

| | | | |
|---|---|---|---|
| 7,702,822 B2 * | 4/2010 | Barrenscheen ............ 710/14 |
| 2006/0059276 A1 | 3/2006 | Muth | |
| 2006/0117118 A1 | 6/2006 | Barrenscheen | |
| 2006/0230262 A1 * | 10/2006 | Jansen et al. ............ 713/2 |

(Continued)

FOREIGN PATENT DOCUMENTS

DE 102 52 165 A1 5/2004

(Continued)

OTHER PUBLICATIONS

Philips Semiconductors: "Product Specification TJA1020 LIN Transceiver", Integrated Circuits Data Sheet, Jan. 13, 2004, pp. 1-22.

(Continued)

*Primary Examiner*—Tammara Peyton
(74) *Attorney, Agent, or Firm*—Muncy, Geissler, Olds & Lowe, PLLC

(57) ABSTRACT

An integrated driver circuit is provided for a LIN bus comprises a first input terminal, a second input terminal, and an output terminal, which is to be connected to a bus line of the LIN bus and at which an output data signal, dependent on an input data signal, is output, whereby the output data signal is output according to a first or according to at least one second LIN bus specification depending on whether the input data signal is applied at the first input terminal or the at least second input terminal.

8 Claims, 2 Drawing Sheets

U.S. PATENT DOCUMENTS

2006/0261856 A1  11/2006  Furusawa
2009/0125656 A1*  5/2009  Haas et al. .................. 710/104

FOREIGN PATENT DOCUMENTS

DE    10 2004 057 788 A1    6/2006

OTHER PUBLICATIONS

Elmenreich W et al: "A Comparison of Fieldbus Protocols: LIN 1.3, LIN 2.0, and TTP/A", Emerging Technologies and Factory Automation, 2005, 10$^{th}$ IEEE Conference on Catania, Italy Sep. 19-22, 2005, pp. 747-753.

Specks J: "LIN—Protocol, development tolls, and software interfaces for local interconnect networks in vehicles", International Conference on Electronic Systems for Vehicles, Oct. 5, 2000.

* cited by examiner

INTEGRATED DRIVER CIRCUIT FOR LIN BUS WHEREIN CIRCUIT IS OPERABLE BETWEEN AN OLDER LIN BUS SPECIFICATION OR A NEWER LIN BUS SPECIFICATION

This nonprovisional application claims priority to German Patent Application No. DE 102006058184, which was filed in Germany on Nov. 29, 2006, and to U.S. Provisional Application No. 60/861,968, which was filed on Dec. 1, 2006, and which are both herein incorporated by reference.

BACKGROUND OF THE INVENTION

1. Field of the Invention

The present invention relates to an integrated driver circuit for a Local Interconnect Network (LIN) bus.

2. Description of the Background Art

Driver circuits of this type are also called LIN bus drivers or LIN transceivers. In the integrated driver circuit, an input data signal, which, for example, is provided by a microcontroller, which intends to transmit data over the LIN bus, is applied at an input terminal. An output data signal dependent on the input data signal, which fulfills voltage levels, edge steepness, etc., according to a LIN specification or a LIN standard, is output at an output terminal of the integrated driver circuit, connected to a bus line of the LIN bus.

At present, there are two customary specifications (standards) for LIN bus drivers. The older of the two specifications, which has the version number V1.3, has slower signal edges than the more recent of the two versions, which has the version number V2.0. At present, both versions are demanded on the market.

Conventional drivers support either the first version V1.3 or the second version V2.0 with the more rapid edges. In the manufacture of integrated driver circuits, it is therefore necessary to implement a version-specific driver circuit for each version.

SUMMARY OF THE INVENTION

It is therefore an object of the present invention to provide an integrated driver circuit for a LIN bus, which can be switched in a simple manner between a first and at least one second specification, so that particularly during the manufacture of the integrated driver circuit, no version-specific differentiation needs to be made, or this is done only in a latest possible manufacturing step.

The integrated driver circuit for a LIN bus comprises a first input terminal, at which an input data signal can be applied, an output terminal, which is to be connected to a bus line of the LIN bus and at which an output data signal dependent on the input data signal is output, at least one second input terminal, whereby the input data signal is to be applied either at the first input terminal or the second input terminal, a transmit circuit, which is looped between the output terminal and the first and second input terminal and which generates the output data signal from the input data signal, whereby the transmit circuit depending on a specification selection signal generates the output data signal according to a first specification (standard) or according to at least one second specification (standard), and a specification selection circuit, which is coupled to the first and the second input terminal and the transmit circuit and generates the specification selection signal depending on whether the input data signal is applied at the first input terminal or the at least second input terminal. The integrated driver circuit can therefore transmit output data signals according to the first specification and the at least second specification (data receipt over the LIN bus can occur in a conventional manner), whereby switching between the different specifications occurs in a simple fashion depending on whether the input data signal is applied at the first input terminal or the at least second input terminal.

In an embodiment, output data signals, generated according to the first specification, have a different edge steepness than output data signals generated according to the second specification. A further differentiating feature between the different specifications can also be a maximum current (short-circuit current) of the integrated driver circuit.

In a development of the integrated driver circuit, the first specification is LIN bus specification version 1.3 and the second specification is LIN bus specification version 2.0. It is understood that future LIN bus specifications are also covered.

In a development of the integrated driver circuit, the specification selection circuit comprises a flip-flop, whereby a first flip-flop input terminal is connected to the first input terminal, a second flip-flop input terminal is connected to the second input terminal, and the specification output signal is applied at a flip-flop output terminal. In this way, it is possible to implement the specification selection circuit by means of a standard element.

In a development of the integrated driver circuit, a first pull-up resistor is looped between the first input terminal and a supply voltage and a second pull-up resistor is looped between the second input terminal and the supply voltage. The unused input terminal is kept statically at a defined high level by means of the pull-up resistors.

In a development of the integrated driver circuit, an AND gate is looped between the transmit circuit and the first and second input terminal; in this case, a first AND gate input terminal is connected to the first input terminal, a second AND gate input terminal is connected to the second input terminal, and an AND gate output terminal is connected to the transmit circuit. When the input terminal, to which the input data signal has not been applied, statically supplies a logic "1" as the input signal of the AND gate, the input data signal is output at the output of the AND gate.

In a development of the integrated driver circuit, the first input terminal is made as a first bond pad and the second input terminal is made as a second bond pad, whereby during a packaging or bonding process of the integrated driver circuit depending on a desired specification either the first bond pad or the second bond pad is contacted by an associated input terminal pin of the integrated driver circuit. The input terminal pin of the integrated driver circuit—also after a packaging step of the integrated circuit—is an outward routed pin, which is contacted electrically during use of the integrated driver circuit, for example, on a printed circuit board, with other circuit parts, for example, a port of a microcontroller. The active specification of the integrated driver circuit is therefore selected in one of the last manufacturing steps of the integrated driver circuit in that the bond pad assigned to the active input terminal is contacted or "bonded" with an outward routed input terminal pin of the circuit. The output terminal is also preferably made as a bond pad, whereby during the packaging process of the integrated driver circuit, the output terminal bond pad is contacted by an associated output terminal pin of the integrated driver circuit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
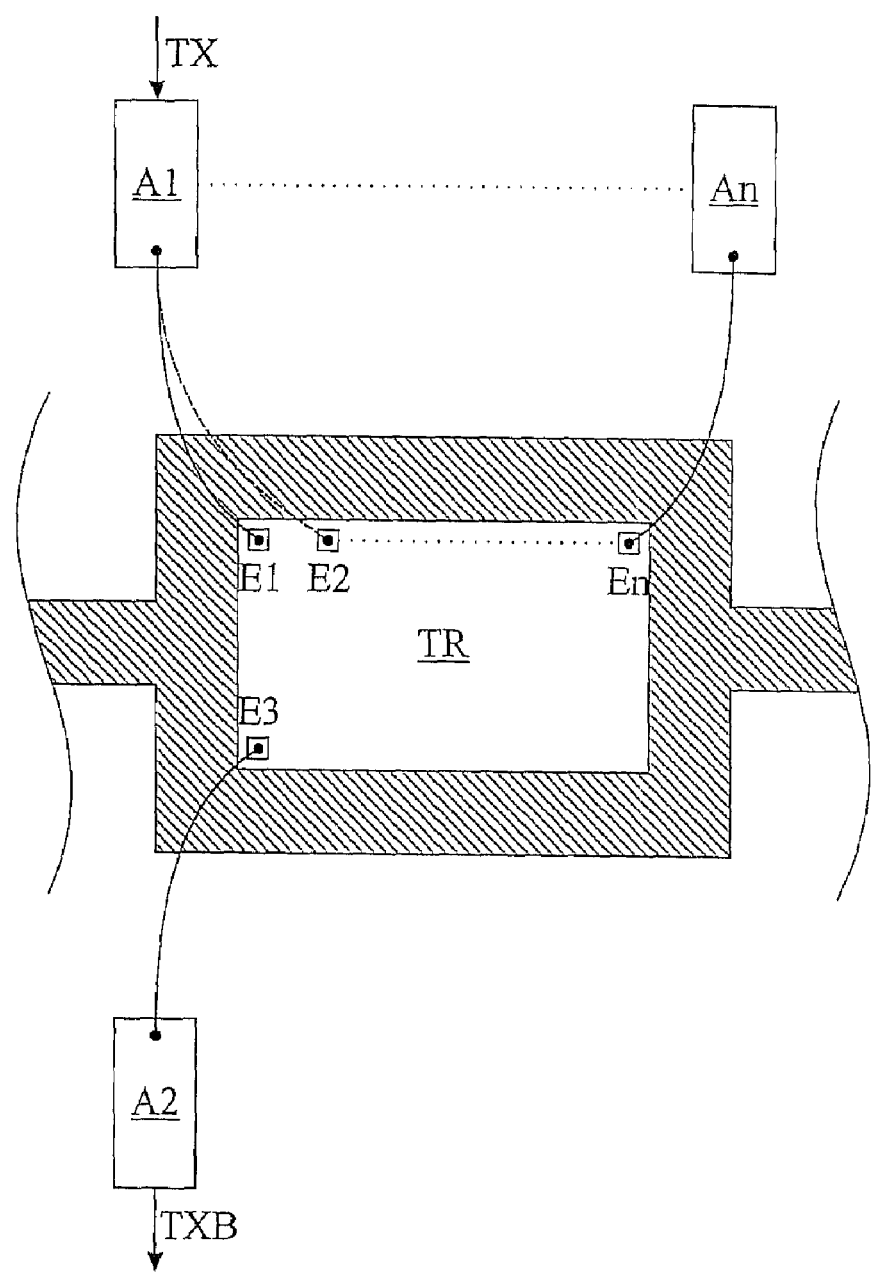
FIG. 1 illustrates an integrated driver circuit for a LIN bus as a so-called "die" during a bonding process.

FIG. 1 shows an integrated driver circuit TR for a LIN bus as a so-called "die" during a bonding or packaging process. The integrated driver circuit TR as a "die" comprises a first input terminal in the form of a first bond pad E1 and a second input terminal in the form of a second bond pad E2, whereby an input data signal TX, the generation of which occurs chip externally, depending on a selected bond variant or bond option is applied either at the first input terminal or first bond pad E1 or the second input terminal or second bond pad E2.

The selected bond variant determines whether an outward routed first input terminal pin A1 of the integrated driver circuit TR, then packaged finished in a housing, is contacted by bond pad E1 or bond pad E2.

An output terminal in the form of a bond pad E3 is contacted via a bond by an outward routed output terminal pin A2 of the integrated driver circuit TR, then packaged finished in a housing. Output terminal pin A2 or indirectly bond pad E3 is connected during operation of integrated driver circuit TR to a bus line (not shown) of a LIN bus system, an output data signal TXB dependent on input data signal TX being output at output terminal pin A2.

Integrated driver circuit TR has other bond pads En, which are not specified in greater detail, and associated terminal pins An, which are capable of providing conventional functions, for example, a receiving path and configuration functions, etc.

According to the invention, the selected bond variant of bond pads E1 and E2 decides for the outward routed input terminal pin A1 the LIN bus specification by which the output data signal TXB, output at output terminal pin A2, is generated. When bond pad E1 is contacted by first input terminal pin A1, output data signals TXB are output according to specification V1.3. When otherwise bond pad E2 is contacted by first input terminal pin A1, output data signals TXB are output according to specification V2.0. The edge steepness according to specification V2.0 is greater than that of specification V1.3.

Figure 2:
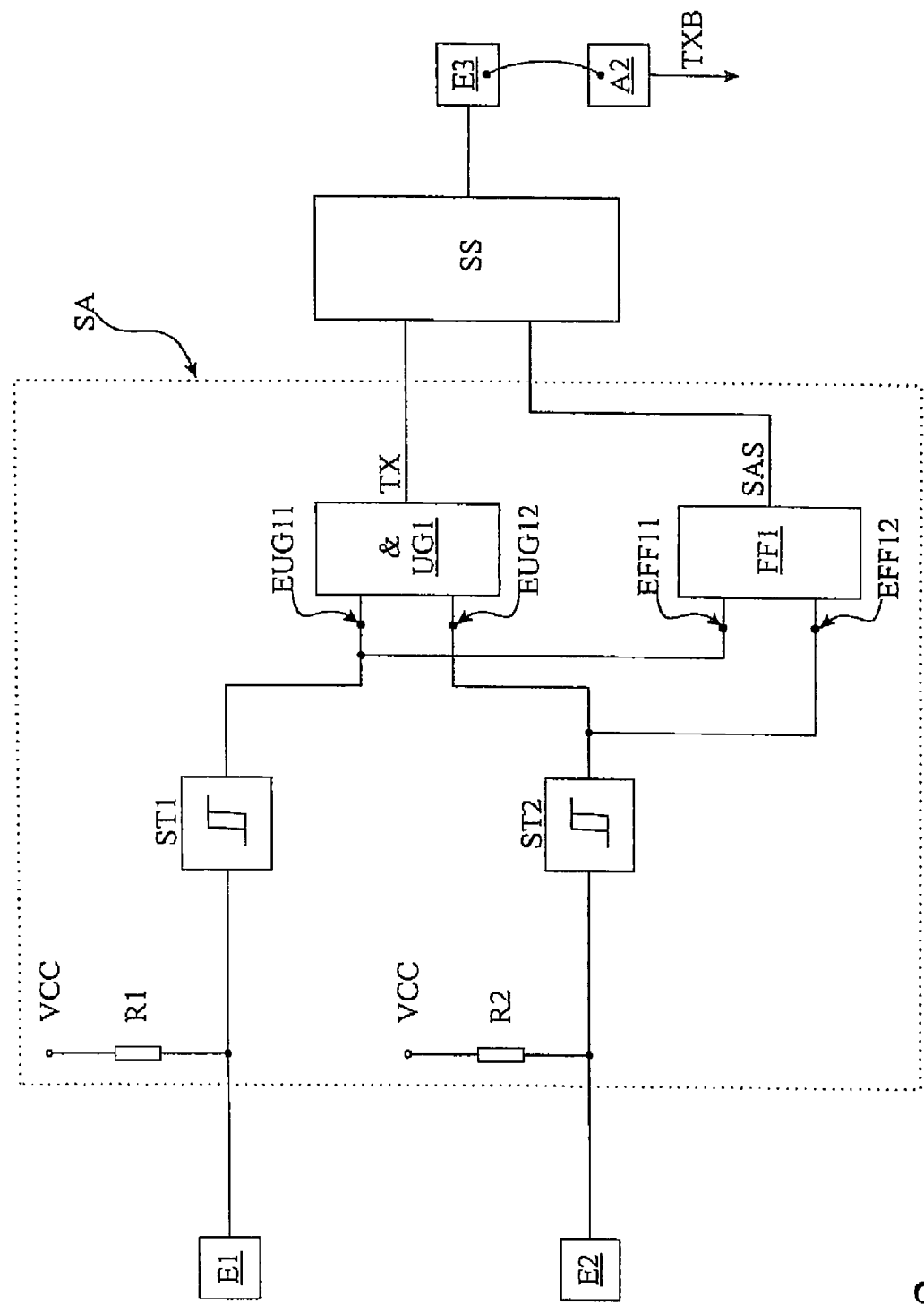
FIG. 2 illustrates a circuit diagram of a specification selection circuit and a transmit circuit of the integrated driver circuit of FIG. 1.

FIG. 2 shows a circuit diagram of a specification selection circuit SA and a transmit circuit SS of the integrated driver circuit TR of FIG. 1. Specification selection circuit SA determines and stores at which of input terminals E1 or E2 the active signal TX is applied and generates a specification selection signal SAS, which is applied at transmit circuit SS. Transmit circuit SS generates output data signals TXB according to the first or second specification depending on a state of specification selection signal SAS.

Specification selection circuit SA is coupled with the first input terminal or first bond pad E1 and the second input terminal or second bond pad E2. A first pull-up resistor R1 is looped between a supply voltage VCC and input terminal E1 and a second pull-up resistor R2 is looped between supply voltage VCC and second input terminal E2. When an input terminal E1 or E2 is not contacted by first input terminal pin A1, it is pulled by its associated pull-up resistor R1 or R2 statically to supply voltage level VCC.

The signal TX applied at an input terminal E1 or E2 is processed by an associated Schmitt trigger ST1 or ST2 and applied at an associated input EUG11 or EUG12 of an AND gate UG1. Because an input terminal E1 or E2, which is not contacted, lies statically at a high level, the signal TX, applied at the contacted input terminal E1 or E2, is output unchanged by the AND gate UG1 to transmit circuit SS, which is looped between output terminal E3 and the first and second input terminal E1 and E2 and which processes input signal TX according to the specification set by the specification selection signal SAS and outputs it as output data signal TXB.

Specification selection circuit SA comprises furthermore a flip-flop FF1; here, a first flip-flop input EFF11 is connected to first input terminal E1 via first Schmitt trigger ST1 and a second flip-flop input EFF12 is connected to second input terminal E2 via Schmitt trigger ST2. Specification selection signal SAS is output at the output of flip-flop FF1 and applied at transmit circuit SS. Transmit circuit SS depending on specification selection signal SAS generates output data signal TXB at output terminal pin A2 according to specification V1.3 or V2.0.

In an initial operating state of integrated driver circuit TR, a high level is applied at both inputs EFF11 and EFF2 of flip-flop FF1. Specification selection signal SAS is hereby generated with a level corresponding to specification V1.3.

When the input terminal or bond pad E1 is routed outward, i.e., is contacted by input terminal pin A1, specification selection signal SAS remains unchanged, even when the signal applied at input terminal E1 is pulled to ground. Output data signal TXB is therefore generated permanently according to specification V1.3.

When alternatively the input terminal or bond pad E2 is routed outward, i.e., is contacted by input terminal pin A1, specification selection signal SAS toggles to a level corresponding to specification V2.0, as soon as the signal applied at input terminal E2 is pulled to ground. This state is stored by the flip-flop, even when the signal applied at input terminal E2 again returns to the VCC level. Output data signal TXB is therefore generated according to specification V2.0.

The specification is therefore selected during operation of integrated driver circuit TR in a simple fashion in that specification selection circuit SA generates specification selection signal SAS depending on whether input data signal TX is applied at first input terminal E1 or the at least second input terminal E2.

A specification or typing of integrated driver circuit TR occurs by means of appropriate contacting of bond pads E1 or E2 by input terminal pin A1 during a packaging or bonding process.

It is understood that switching is also possible between more than two specifications by means of additional input terminals. Furthermore, the specification switching is not limited to versions V1.3 and V2.0, but also comprises future specifications or standards or switching between additional parameters.

In summary, integrated driver circuit TR comprises a first input terminal, at least one second input terminal, and an output terminal, which is to be connected to a bus line of the LIN bus and at which an output data signal, dependent on an input data signal, is output, whereby the output data signal is output according to a first or according to at least one second LIN bus specification depending on whether the input data signal is applied at the first input terminal or the at least second input terminal.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

The invention claimed is:

1. An integrated driver circuit for a Local Interconnect Network LIN bus, the circuit comprising:
    a first input terminal at which an input data signal is applied;
    an output terminal, which is connected to a bus line of the LIN bus and at which an output data signal dependent on the input data signal is outputted;
    at least one second input terminal, whereby the input data signal is applied either at the first input terminal or the second input terminal;
    a transmit circuit, which is looped between the output terminal and the first and second input terminal and which generates the output data signal from the input data signal, whereby the transmit circuit, depending on a specification selection signal, generates the output data signal according to a first LIN bus specification or according to at least one second LIN bus specification, wherein the first LIN bus specification is different than the second LIN bus specification; and
    a specification selection circuit, which is coupled to the first and second input terminal and the transmit circuit and generates the specification selection signal depending on whether the input data signal is applied at the first input terminal or the at least second input terminal.

2. The integrated driver circuit according to claim 1, wherein output data signals, generated according to the first specification, have a different edge steepness than output data signals generated according to the second specification.

3. The integrated driver circuit according to claim 1, wherein the first specification is LIN bus specification version 1.3 and the second specification is LIN bus specification version 2.0.

4. The integrated driver circuit according to claim 1, wherein the specification selection circuit comprises a flip-flop, whereby a first flip-flop input terminal is connected to the first input terminal, a second flip-flop input terminal is connected to the second input terminal, and the specification selection signal is applied at a flip-flop output terminal.

5. The integrated driver circuit according to claim 1, wherein a first pull-up resistor is looped between the first input terminal and a supply voltage and a second pull-up resistor is looped between the second input terminal and the supply voltage.

6. The, integrated driver circuit according to claim 1, wherein an AND gate is looped between the transmit circuit and the first and second input terminal, wherein a first AND gate input terminal is connected to the first input terminal, a second AND gate input terminal is connected to the second input terminal, and an AND gate output terminal is connected to the transmit circuit.

7. The integrated driver circuit according to claim 1, wherein the first input terminal is formed as a first bond pad and the second input terminal is formed as a second bond pad, wherein during a packaging process of the integrated driver circuit, depending on a desired specification, either the first bond pad or the second bond pad is contacted by an associated input terminal pin of the integrated driver circuit.

8. The integrated driver circuit according to claim 7, wherein the output terminal is formed as a bond pad, and wherein during the packaging process of the integrated driver circuit, the bond pad is contacted by an associated output terminal pin of the integrated driver circuit.

* * * * *